United States Patent
Dupuis et al.

(10) Patent No.: US 7,106,137 B2
(45) Date of Patent: Sep. 12, 2006

(54) METHOD AND APPARATUS FOR CONTROLLING THE OUTPUT POWER OF A POWER AMPLIFIER

(75) Inventors: Timothy J. Dupuis, Austin, TX (US); Ryan M. Bocock, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/880,962

(22) Filed: Jun. 30, 2004

(65) Prior Publication Data
US 2005/0030100 A1 Feb. 10, 2005

Related U.S. Application Data

(63) Continuation of application No. 10/378,779, filed on Mar. 4, 2003, now Pat. No. 6,897,730.

(51) Int. Cl.
*H03G 3/10* (2006.01)
(52) U.S. Cl. .................. 330/285; 330/296; 330/297
(58) Field of Classification Search ............... 330/297, 330/296, 129, 285
See application file for complete search history.

(56) References Cited

U.S. PATENT DOCUMENTS

| | | | |
|---|---|---|---|
| 3,900,823 A | 8/1975 | Sokal et al. | |
| 4,021,751 A | 5/1977 | Suzuki | |
| 4,075,574 A | 2/1978 | Gilbert | |
| 4,165,493 A | 8/1979 | Harrington | |
| 4,590,436 A | 5/1986 | Butler et al. | |
| 4,604,532 A | 8/1986 | Gilbert | |
| 4,649,467 A | 3/1987 | Vesce et al. | |
| 4,772,856 A | 9/1988 | Nojima et al. | |
| 4,808,907 A | 2/1989 | Main | |
| 4,857,865 A | 8/1989 | Berman et al. | |
| 4,893,030 A | 1/1990 | Shearer et al. | |
| 4,990,803 A | 2/1991 | Gilbert | |
| 5,023,566 A | 6/1991 | El-Hamamsy et al. | |
| 5,118,997 A | 6/1992 | El-Hamamsy | |
| 5,274,341 A | 12/1993 | Sekine et al. | |
| 5,291,123 A | 3/1994 | Brown | |
| 5,298,811 A | 3/1994 | Gilbert | |
| 5,327,337 A | 7/1994 | Cripe | |
| 5,343,162 A | 8/1994 | Davis | |
| 5,345,185 A | 9/1994 | Gilbert | |
| 5,420,537 A | 5/1995 | Weedon et al. | |
| 5,434,537 A | 7/1995 | Kukkonen | |
| 5,450,036 A | 9/1995 | Nishioka et al. | |

(Continued)

FOREIGN PATENT DOCUMENTS

DE 4419318 7/1995

(Continued)

OTHER PUBLICATIONS

Sokal, N. O. and Sokal, A. D., "Class E—A new class of high-efficiency tuned single ended switching power amplifiers," IEEE Journal of Solid State Circuits, vol. SC-10, No. 3, Jun. 1975, pp. 168-176.

(Continued)

*Primary Examiner*—Patricia Nguyen
(74) *Attorney, Agent, or Firm*—Johnson & Associates

(57) ABSTRACT

A method and apparatus is provided for use with a power amplifier to provide a regulated supply to the power amplifier. The invention uses a combination of voltage and current regulation to overcome the problems encountered in the prior art. In one example, voltage regulation is used at high power levels, while current regulation is used at low power levels.

18 Claims, 4 Drawing Sheets

U.S. PATENT DOCUMENTS

| | | | |
|---|---|---|---|
| 5,477,188 A | 12/1995 | Chawla et al. | |
| 5,497,125 A * | 3/1996 | Royds | 330/290 |
| 5,604,383 A | 2/1997 | Matsuzaki | |
| 5,612,647 A | 3/1997 | Malec | |
| 5,623,231 A | 4/1997 | Mohwinkel et al. | |
| 5,625,205 A | 4/1997 | Kusama | |
| 5,635,872 A | 6/1997 | Zimmerman | |
| 5,646,578 A | 7/1997 | Loh et al. | |
| 5,648,743 A | 7/1997 | Nagaya et al. | |
| 5,726,603 A | 3/1998 | Chawla et al. | |
| 5,742,205 A | 4/1998 | Cowen et al. | |
| 5,789,984 A * | 8/1998 | Davis et al. | 330/279 |
| 5,831,331 A | 11/1998 | Lee | |
| 5,834,978 A | 11/1998 | Cho | |
| 5,867,061 A | 2/1999 | Rabjohn et al. | |
| 5,880,635 A | 3/1999 | Satoh | |
| 5,942,946 A | 8/1999 | Su et al. | |
| 5,955,926 A | 9/1999 | Uda et al. | |
| 5,969,582 A | 10/1999 | Boesch et al. | |
| 5,973,368 A | 10/1999 | Pearce et al. | |
| 5,974,041 A | 10/1999 | Kornfeld et al. | |
| 5,986,500 A | 11/1999 | Park et al. | |
| 6,008,698 A | 12/1999 | Dacus et al. | |
| 6,011,438 A | 1/2000 | Kakuta et al. | |
| 6,016,075 A | 1/2000 | Hamo | |
| 6,047,167 A | 4/2000 | Yamashita | |
| 6,047,168 A | 4/2000 | Carlsson et al. | |
| 6,069,528 A | 5/2000 | Kashima | |
| 6,075,995 A | 6/2000 | Jensen | |
| 6,133,793 A | 10/2000 | Lau et al. | |
| 6,137,273 A | 10/2000 | Bales et al. | |
| 6,147,511 A | 11/2000 | Patel et al. | |
| 6,157,258 A | 12/2000 | Adishian et al. | |
| 6,167,134 A | 12/2000 | Scott et al. | |
| 6,181,207 B1 | 1/2001 | Chevallier et al. | |
| 6,198,347 B1 | 3/2001 | Sander et al. | |
| 6,203,516 B1 | 3/2001 | Kepley | |
| 6,208,549 B1 | 3/2001 | Rao et al. | |
| 6,208,875 B1 | 3/2001 | Damgaard et al. | |
| 6,222,788 B1 | 4/2001 | Forbes et al. | |
| 6,232,634 B1 | 5/2001 | Wu et al. | |
| 6,236,271 B1 | 5/2001 | Vakilian | |
| 6,265,939 B1 | 7/2001 | Wan et al. | |
| 6,274,937 B1 | 8/2001 | Ahn et al. | |
| 6,319,829 B1 | 11/2001 | Pasco et al. | |
| 6,323,735 B1 | 11/2001 | Welland et al. | |
| 6,362,606 B1 | 3/2002 | Dupuis et al. | |
| 6,384,540 B1 | 5/2002 | Porter, Jr. et al. | |
| 6,392,488 B1 | 5/2002 | Dupuis et al. | |
| 6,407,639 B1 | 6/2002 | Jean et al. | |
| 6,448,847 B1 | 9/2002 | Paul et al. | |
| 6,462,620 B1 | 10/2002 | Dupuis et al. | |
| 6,464,511 B1 | 10/2002 | Watanabe et al. | |
| 6,492,872 B1 | 12/2002 | Fujioka et al. | |
| 6,549,071 B1 | 4/2003 | Paul et al. | |
| 6,566,944 B1 * | 5/2003 | Pehlke et al. | 330/10 |
| 6,614,309 B1 * | 9/2003 | Pehlke | 330/296 |
| 6,653,902 B1 * | 11/2003 | Bachhuber et al. | 330/285 |
| 6,677,821 B1 | 1/2004 | Kusunoki et al. | |
| 6,828,859 B1 | 12/2004 | Dupuis | |
| 2002/0044018 A1 | 4/2002 | Dupuis et al. | |

FOREIGN PATENT DOCUMENTS

| | | |
|---|---|---|
| EP | 399561 | 11/1990 |
| EP | 0413348 A2 | 2/1991 |
| EP | 0654898 A2 | 5/1995 |
| JP | 03128513 A | 5/1991 |
| JP | 63-7011 | 1/1998 |
| JP | 200074559 | 6/2000 |
| WO | WO 98/37627 | 8/1998 |
| WO | WO 00/16492 | 3/2000 |

OTHER PUBLICATIONS

Makiihara, Chihiro et al., "The Possibility of High Frequency Functional Ceramics Substrate", International Smposium on Mulilayer Electronic Ceramic Devices, May 5, 1998 in Cincinati, Ohio.

Huange et al., "A BiCMOS / Automatic Gain Control Amplifier for SONET OC-3", Proceedings of the IEEE Custom IC Conference, May 1-4, 1995, pp. 103-106.

Webster, "Websters Ninth New Collegiate Dictionary", Merriam-Webster, 1991, pp. 971.

Toffolo et al., "Development of a CMOS switched capacitor instrumentation amplifier", IEEE Colloquium on ASICS, Apr. 10, 1992 pp. 2/1.

G. Trauth V. Vanhuffel J. Trichet, "An Advanced Controller for Multi-Band Open Loop Power Control Mode RF Power Amplifier", Microwave Engineering, Jul. 2002, pp. 39-40.

RF Micro Devices, Inc., RF3110 Triple-Band GSM/DCS/PCS Power AMP Module Data Sheet, pp. 2-401-2-412.

Berglund, "A Note on Power-Law Devices and Their Effect on Signal-to-Noise Ratio", IEEE Transactions on Information Theory, vol. 10, Issue 1, Jan. 1964, p.p. 52-57.

* cited by examiner

METHOD AND APPARATUS FOR CONTROLLING THE OUTPUT POWER OF A POWER AMPLIFIER

CROSS REFERENCE TO RELATED APPLICATIONS

This application is a continuation of commonly owned U.S. patent application Ser. No. 10/378,779 filed on Mar. 4, 2003, now U.S. Pat. No. 6,897,730, entitled "METHOD AND APPARATUS FOR CONTROLLING THE OUTPUT POWER OF A POWER AMPLIFIER" (pending). This application is related to Ser. No. 09/660,123, entitled "POWER AMPLIFIER CIRCUITRY AND METHOD USING AN INDUCTANCE COUPLED TO POWER AMPLIFIER SWITCHING DEVICES", by Susanne A. Paul et al. (U.S. Pat. No. 6,549,071), which is expressly incorporated by reference herein.

FIELD OF THE INVENTION

This invention relates to power amplifiers. In particular, this invention relates to techniques for controlling the output power of power amplifiers.

BACKGROUND OF THE INVENTION

In some applications utilizing power amplifiers, there is a need to vary the output power delivered to a load. For example, in a cell phone environment, it is desired to vary the output power of the cell phone based on various factors. For example, a base station may dictate the power level at which each cell phone should transmit (based on factors such as the physical distance from the base station, for example).

A standard method of controlling the output power of a power amplifier is to use a voltage regulator to regulate the battery or power supply voltage. Typical approaches to controlling the output power of a power amplifier use an "open loop" or a "closed loop" control technique. Closed loop techniques use an RF sensor, such as a directional coupler, to detect the power amplifier output power. The detected output power is used in a feedback loop to regulate the output power. "Open loop" techniques control the output power by regulating either the power supply voltage or power supply current used by the power amplifier. Open loop techniques are popular since open loop techniques do not have the loss and complexity associated with RF sensor elements.

Open loop techniques have several problems. For example, because output sensing is not used, components using open loop techniques suffer from inaccuracies and part-to-part variations. It would be desirable to use an open loop technique which achieves low thermal and minimal part-to-part variation.

FIGS. 1 and 2 show two prior art examples of open loop techniques for regulating the output power of a power amplifier. FIG. 1 is a schematic diagram showing an open loop voltage regulation technique. FIG. 1 shows a power amplifier 100 and a voltage regulator 102. The voltage regulator 102 is comprised of switching device M1, op-amp 104, and a feedback loop. The voltage regulator 102 provides a regulated voltage to the power amplifier 100, based on the voltage sensed and a desired power level indicated by an automatic power control signal $V_{APC}$. FIG. 2 is a schematic diagram showing an open loop current regulation technique. Like FIG. 1, FIG. 2 shows a power amplifier 100 and a voltage regulator 102. The voltage regulator 102 is comprised of switching device M1, op-amp 104, a current sense resistor R1, and a feedback loop. The voltage regulator 102 provides a regulated current to the power amplifier 100, based on the current sensed through resistor R1 and a desired power level indicated by power control signal $V_{APC}$.

In general, voltage regulation is preferred in an open loop design since voltage regulation does not suffer from the loss associated with a current sensing element, such as resistor R1 in FIG. 2. However, in many power amplifier designs, and especially in CMOS designs, voltage regulation can result in large thermal and part-to-part variations. These problems are caused in part by thermal voltage ($V_T$) variations in transistors, which result in large power variations at low power, when the regulated voltage is close to the thermal voltage ($V_T$) limit.

SUMMARY OF THE INVENTION

A circuit of the invention is provided for controlling the output power of a power amplifier comprising: a voltage sensor; a current sensor; and control circuitry coupled to the voltage sensor and the current sensor for controlling the output power of the power amplifier.

Another embodiment of the invention provides a power regulator for use with a power amplifier, the power regulator comprising: a voltage regulator; a current regulator; and control circuitry coupled to the voltage regulator and to the current regulator for regulating the output power of the power amplifier using the voltage regulator and the current regulator.

Another embodiment of the invention provides an integrated circuit comprising: a power amplifier; a voltage sensor; a current sensor; and control circuitry coupled to the voltage sensor and the current sensor for controlling the output power of the power amplifier using information from the voltage and current sensors.

Another embodiment of the invention provides a method of controlling the output power of a power amplifier comprising: providing a voltage regulator; providing a current regulator; and controlling the output power of a power amplifier using the voltage regulator at high power levels and using the current regulator at low power levels.

Another embodiment of the invention provides a method of controlling the output power of a power amplifier comprising: sensing current provided to the power amplifier; sensing voltage provided to the power amplifier; selectively using the sensed current and sensed voltage to control the output power of the power amplifier.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following illustrates an example of a typical application of the present invention. A power amplifier using the power control techniques of the present invention may be used with a wireless transmission system such as a wireless telephone or other device. In a wireless device such as a cellular telephone, the wireless device may include a transceiver, an antenna duplexer, and an antenna. Connected between the transceiver and the antenna duplexer is an RF power amplifier for amplifying signals for transmission via the antenna. In the case of a wireless telephone application, the invention may be applied to GSM, CDMA, PCS, DCS, etc., or other wireless systems. This is just one example of an application of a power amplifier utilizing the present invention. The invention may also be used in any other application requiring a power amplifier.

Generally, the present invention uses a combination of voltage and current regulation to regulate the output power of a power amplifier. In one example, voltage regulation is used at high power levels (i.e., a first output voltage range), while current regulation is used at low power levels (i.e., a second output voltage range).

Figure 3:
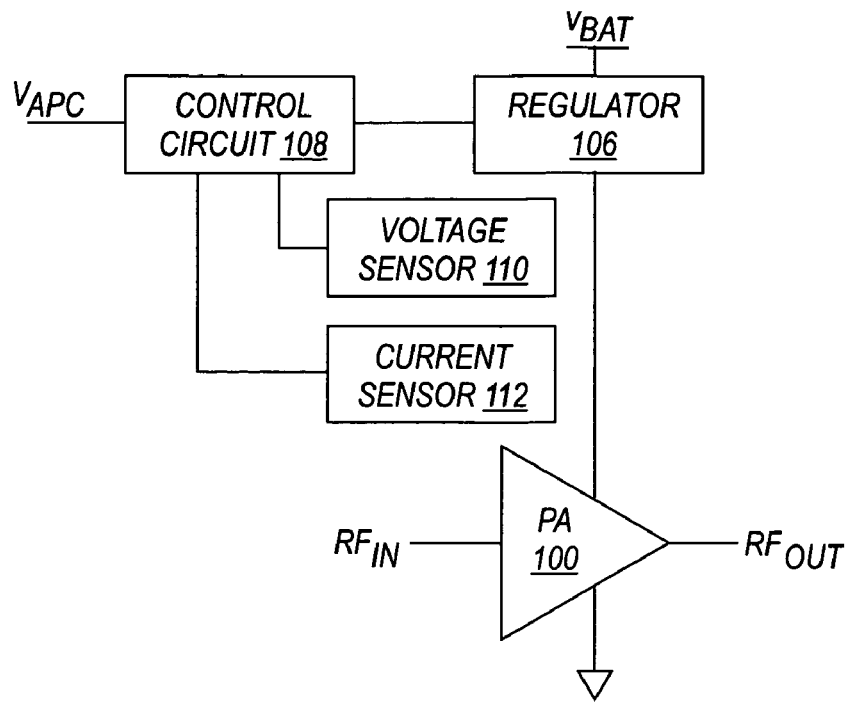
FIG. 3 is a block diagram of one example of a power regulation technique of the present invention.

FIG. 3 is a block diagram of one example of a power regulation technique of the present invention. FIG. 3 shows a power amplifier 100 and a regulator 106. Connected to the regulator 106 is a control circuit 108. The control circuit 108 is connected to a power control signal $V_{APC}$, a voltage sensor 110, and a current sensor 112. The control circuit 108 and regulator 106 control the output power of the power amplifier 100 based on the power control signal $V_{APC}$ and the sensed voltage and current. In one example, the power amplifier 100 is powered using voltage regulation at high power levels and current regulation at low power levels. In this example, at high power levels, the control circuit 108 and regulator 106 use the sensed voltage to regulate the output power of the power amplifier 100. At low power levels, the control circuit 108 and regulator 106 use the sensed current to regulate the output power of the power amplifier 100.

Figure 4:
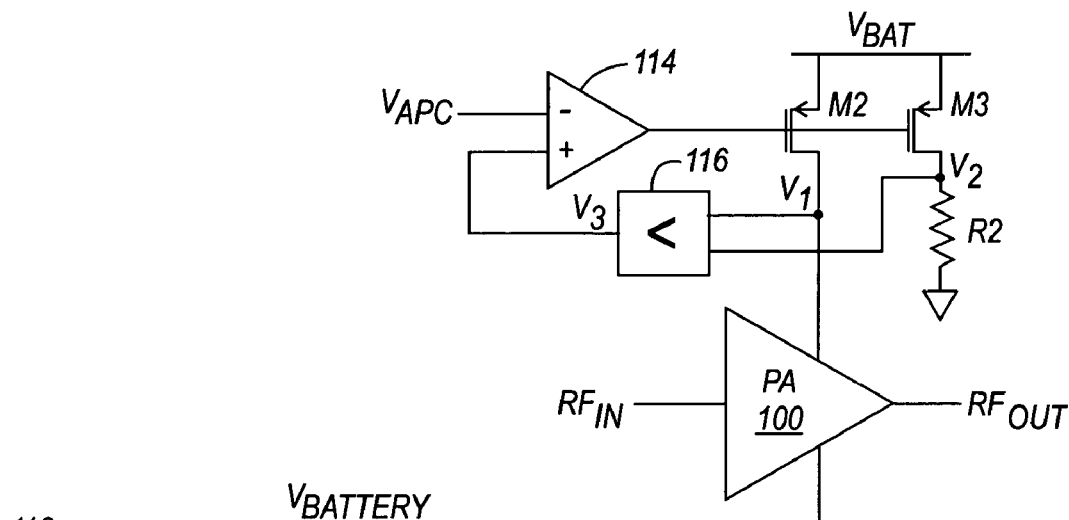
FIG. 4 is a schematic diagram illustrating one implementation of the present invention.

FIG. 4 is a schematic diagram illustrating one implementation of the circuit shown in FIG. 3. FIG. 4 shows an op-amp 114 with one input connected to $V_{APC}$ and a second input connected to the output V3 of a less than block 116. One example of a less than block is described below with respect to FIG. 5. The less than block 116 has two inputs. A first input V1, is connected to the node between the power amplifier 100 and a first switching device M2. A second input V2 is connected to the node between a second switching device M3 and a current sense resistor R2. The voltage of the output V3 of the less than block 116 will approximate the lesser of the inputs V1, and V2., as illustrated in the following equations:

$$V_3 = V_1, \text{ when } V_1 < V_2; \text{ and}$$

$$V_3 = V_2, \text{ when } V_2 < V1.$$

In the circuit shown in FIG. 4, switching devices M2 and M3 operate as a current mirror, with M3 being much smaller than M2. Resistor R2 is sized such that, at high power, switching device M3 will saturate and V2 will be close to $V_{BAT}$. Therefore, V1 will be less than V2 at high power levels, and V3 will be equal to V1. With V3 equal to V1, the circuit operates as a voltage regulator (since the power amplifier is controlled by sensing the voltage at V1). At low power levels, V1 becomes higher than V2 due to the threshold voltage non-linearity of the power amplifier 100. Therefore, V3 will be equal to V2 at low power levels. With V3 equal to V2, the circuit operates as a current regulator (since the power amplifier is controlled by sensing the current provided to resistor R2). In the embodiment described above, V3 approximates V1 or V2. In another example, V3 may not approximate V1 or V2, but is related to one or the other. For example, at high power levels, V3 can be proportional to V1 without approximating V1. Similarly, at low power levels, V3 can be proportional to V2 without approximating V2. Other embodiments are also possible.

Figure 5:
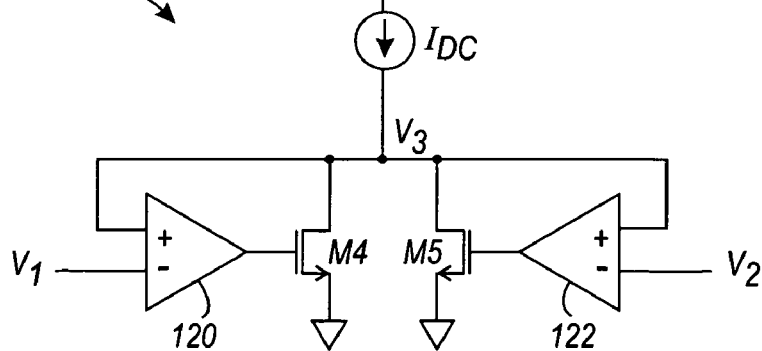
FIG. 5 is a schematic diagram of a less than circuit.

The less than block 116 shown in FIG. 4 can be implemented in any desired way. Following is a description of one example of a circuit for providing a less than function. FIG. 5 is a schematic diagram of a less than circuit 116. As mentioned above, the less than block 116 has an output V3 that is approximately equal to the lesser of inputs V1 and V2. The implementation shown in FIG. 5 shows a first op-amp 120 having two inputs connected to V1 and V3. A second op-amp 122 has two inputs connected to V2 and V3. A DC current source $I_{DC}$ is also provided to V3. The output of op-amp 120 is provided to a switching device M4, which is coupled between V3 and a reference node (e.g., ground). The output of op-amp 122 is provided to a switching device M5, which is also coupled between V3 and a reference node (e.g., ground). Op-amps 120 and 122, in combination with switching devices M4 and M5, are only capable of sinking current from V3. When V1 is greater than V2 (at low power), the gate of switching device M4 is forced to ground and M4 turns off. V3 is then equal to V2. Similarly, when V2 is greater than V1 (at high power), the gate of switching device M5 is forced to ground and M5 turns off. V3 is then equal to V1. If V1 and V2 are equal, switching devices M4 and M5 will both be turned on and current from current source $I_{DC}$ will be split between them such that $V_3 = V_1 = V_2$.

Figure 1:
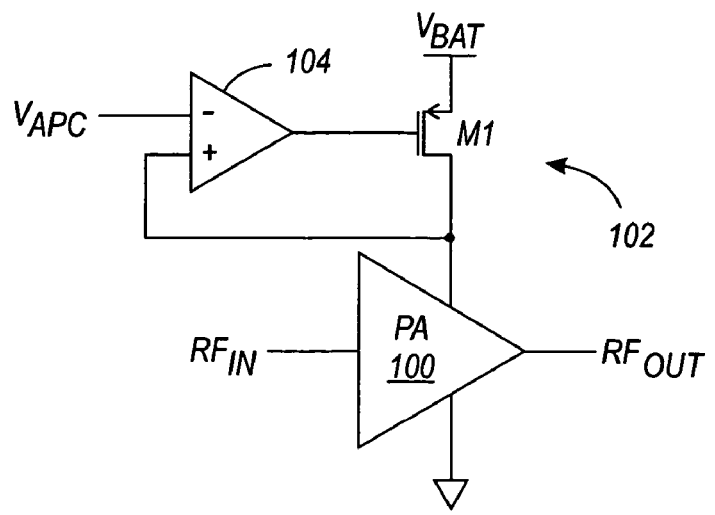
FIG. 1 is a schematic diagram showing an open loop voltage regulation technique.
Figure 2:
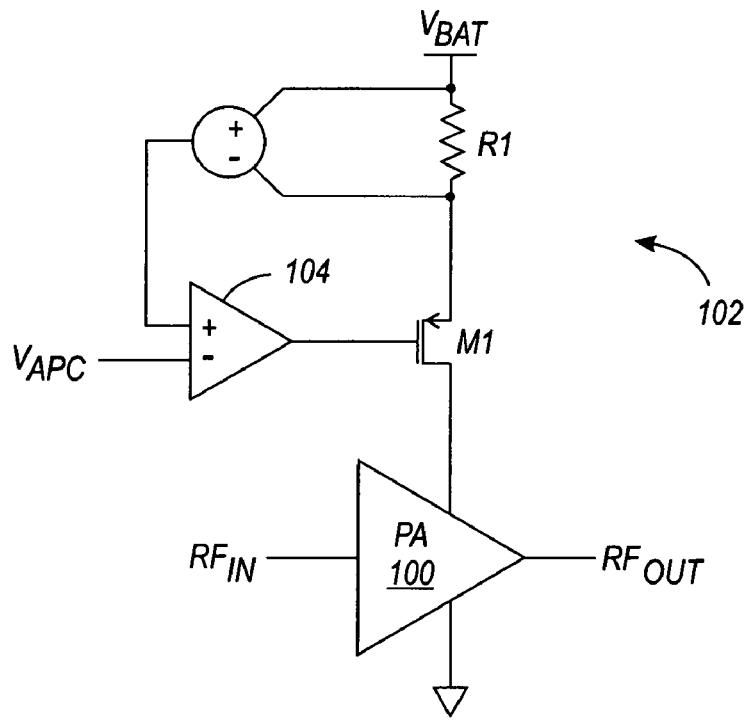
FIG. 2 is a schematic diagram showing an open loop current regulation technique.
Figure 6:
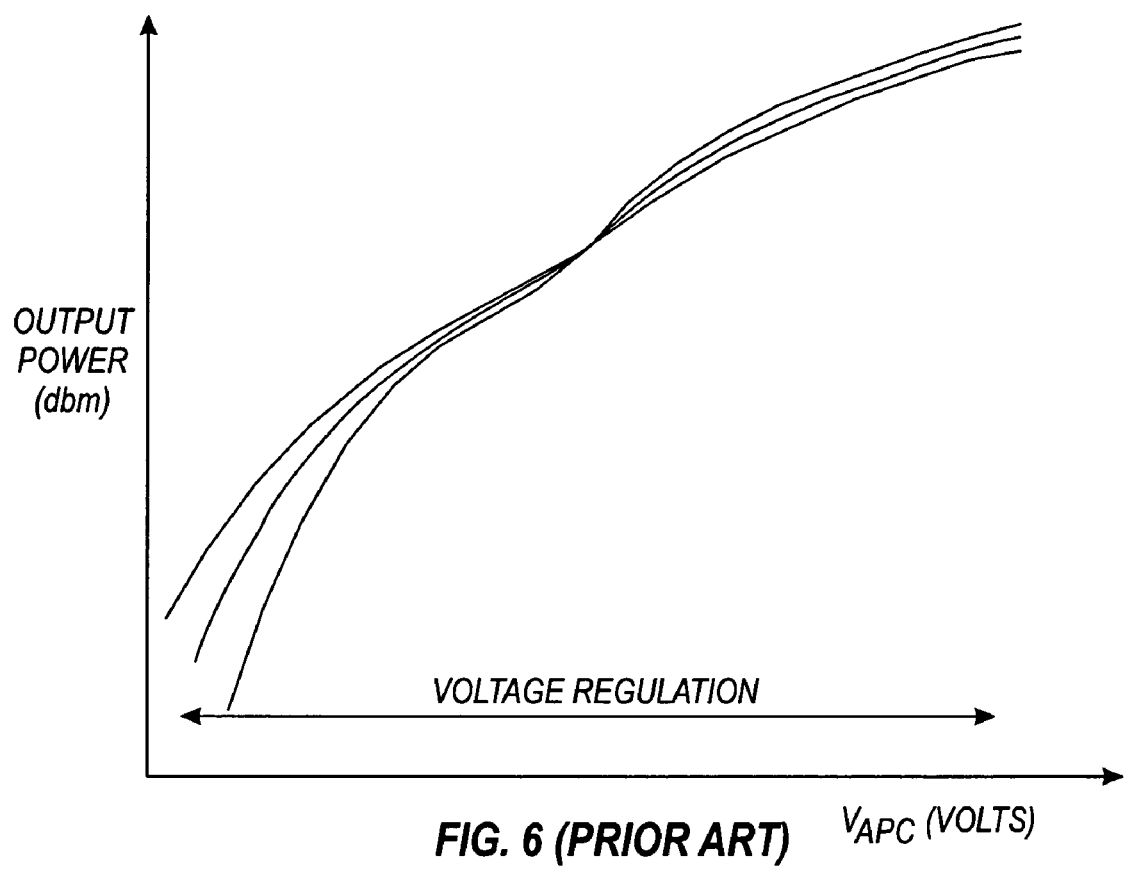
FIGS. 6 and 7 are plots illustrating the improved performance of the present invention.
Figure 7:
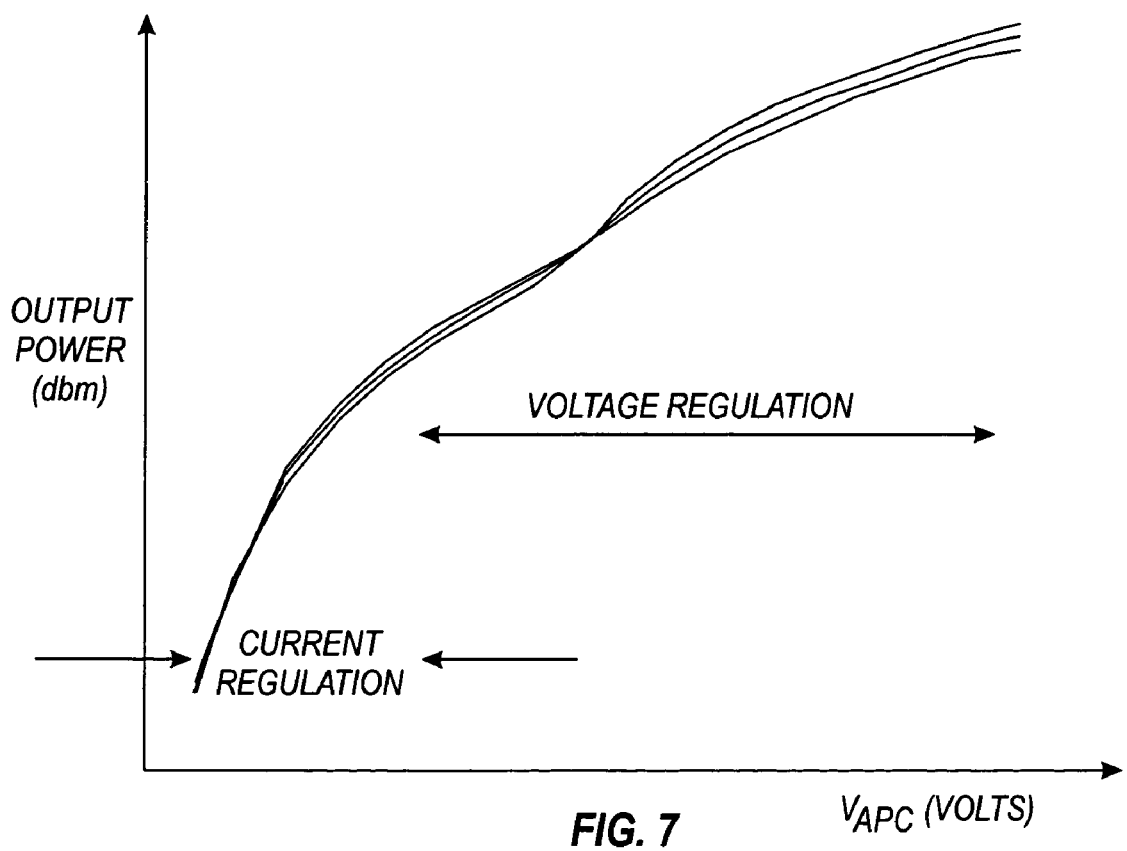

FIGS. 6 and 7 are plots illustrating the improved performance of the present invention. FIG. 6 is a plot of the output power (dbm) versus the voltage of a power control signal $V_{APC}$ at three different temperatures (e.g., high, nominal, and low temperatures) of a prior art power amplifier regulated by a voltage regulator (e.g., FIG. 1). As shown in FIG. 6, the output power variation is relatively small at higher power levels, but increases as the output power level decreases. Therefore, it can be seen that voltage regulation is satisfactory at high power levels, but is less reliable at low power levels.

The present invention takes advantage of the reliability of voltage regulation at high power levels, and the reliability of current regulation at low power levels. FIG. 7 is a plot similar to FIG. 6, illustrating the improvement provided by the present invention. At higher power levels, voltage regulation is used, resulting in plots similar to those shown in FIG. 6. As the power decreases, the regulator of the present invention changes from a voltage regulator to a current regulator, thereby improving the output power variation for the three temperatures shown.

Figure 8:
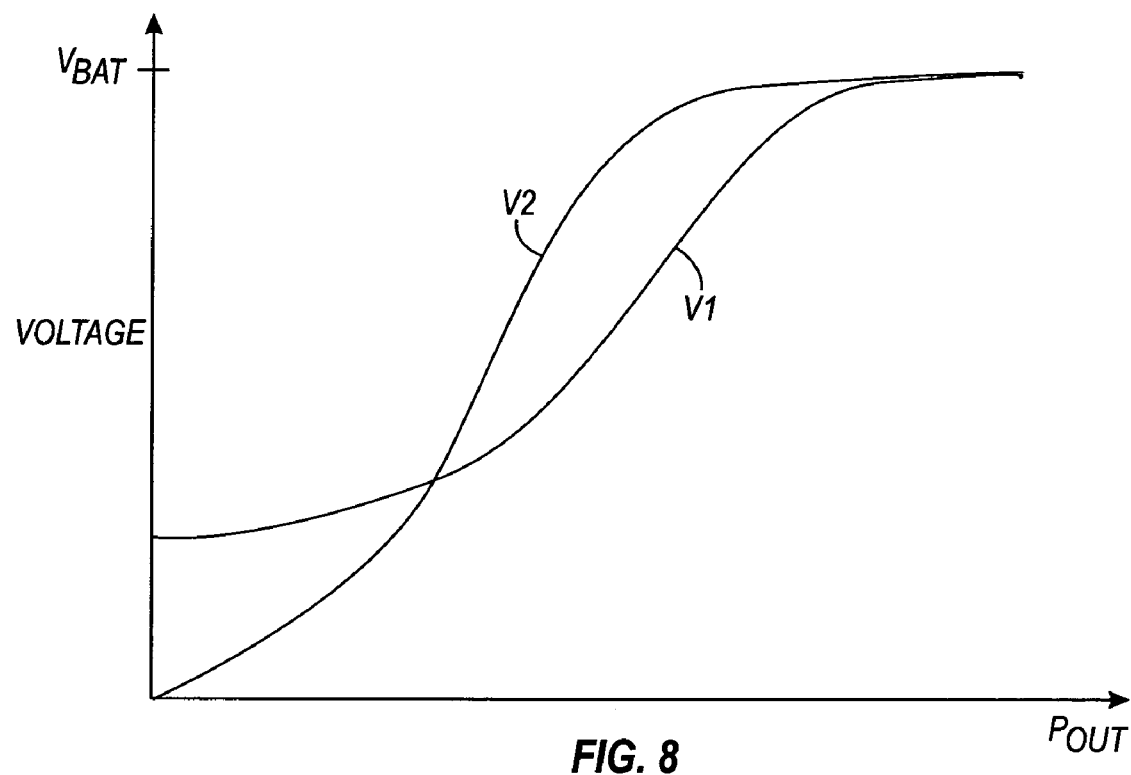
FIGS. 8 and 9 are timing diagrams illustrating the relationship between signals V1, V2 and V3.
Figure 9:
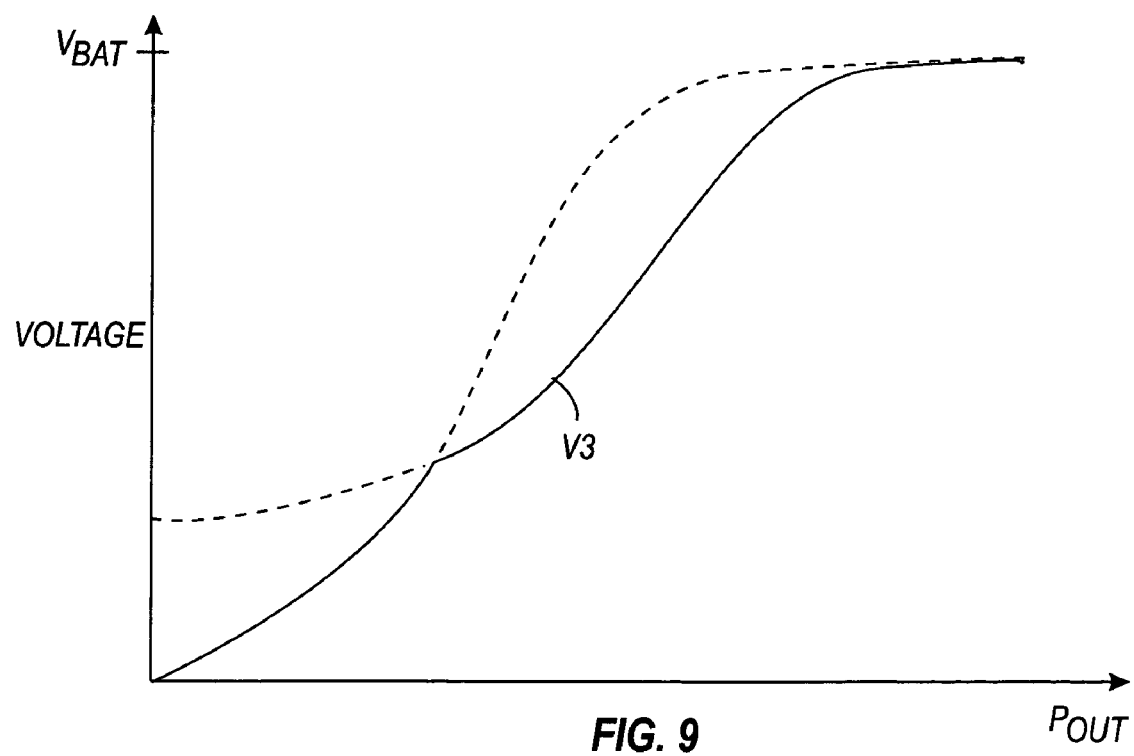

FIGS. 8 and 9 are timing diagrams illustrating the relationship between signals V1, V2 and V3. FIG. 8 illustrates the voltage of signals V1 and V1 as a function of the output power ($P_{OUT}$) of the power amplifier. As shown, at higher power levels (the right portion of FIG. 8), V1 is less than V2.

At lower power levels (the left portion of FIG. 8), $V_2$ is less than $V_1$. FIG. 9 illustrates the voltage of signal $V_3$ as a function of the output power ($P_{OUT}$) of the power amplifier. Since signal $V_3$ is equal to the lesser of $V_1$ and $V_2$, $V3$ is similar to $V_2$ at lower power levels and similar to $V1$ at higher power levels. The remaining portions of $V_1$ and $V_2$ are shown by dashed lines to help illustrate the relationship between $V_3$ and $V_1$ and $V_2$. At the point where the $V_1$ and $V_2$ plots cross, the power control technique of the present invention switches between current regulation and voltage regulation.

The present invention may be used in conjunction with any device requiring a regulated power supply, such as power amplifiers. The invention may be implemented in an integrated circuit (e.g., CMOS, etc.) or implemented using discrete components. If desired, the invention can be implemented in the same integrated circuit that contains the device requiring the regulated power (e.g., a power amplifier, etc.).

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of controlling the output power of a power amplifier comprising:
   sensing the power amplifier supply voltage;
   sensing the power amplifier supply current;
   while the output voltage of the power amplifier is below a threshold level, using the sensed power amplifier supply current to regulate the supply current of the power amplifier to maintain a desired power amplifier output power level; and
   while the output voltage of the power amplifier is above a threshold level, using the sensed power amplifier supply voltage to regulate the supply voltage of the power amplifier to maintain a desired power amplifier output power level.

2. The method of claim 1, further comprising:
   generating a first signal based on the sensed power amplifier supply voltage; and
   generating a second signal based on the sensed power amplifier supply current.

3. The method of claim 2, wherein the output power is control led using the signal having the lower voltage level.

4. The method of claim 2 wherein the first signal is used to control the output power of the power amplifier while the output voltage of the power amplifier is above a threshold level, and the second signal is used to control the output power of the power amplifier while the output voltage of the power amplifier is below a threshold level.

5. The method of claim 1, further comprising using a power control signal with the sensed power amplifier supply voltage or the sensed power amplifier supply current to control the output power of the power amplifier.

6. A power regulator for supplying regulated power to a power amplifier, the power regulator comprising:
   a voltage regulator configured to provide a regulated supply voltage to a power amplifier;
   a current regulator configured to provide a regulated supply current to a power amplifier;
   control circuitry coupled to the voltage regulator and to the current regulator for controlling the operation of the voltage regulator and the current regulator;
   wherein, over a first power amplifier output voltage range, the control circuitry uses the voltage regulator and a power control signal to regulate the supply voltage to the power amplifier; and
   wherein, over a second power amplifier output voltage range, the control circuitry uses the current regulator and the power control signal to regulate the supply current to the power amplifier.

7. The power regulator of claim 6, wherein the control circuitry uses the voltage regulator at high output power levels, and uses the current regulator at low output power levels.

8. The power regulator of claim 6, further comprising a voltage sensor and a current sensor.

9. The power regulator of claim 8, wherein the control circuitry regulates the output power of the power amplifier based on voltage sensed by the voltage sensor and current sensed by the current sensor.

10. The power regulator of claim 8, wherein the voltage sensor generates a first signal and the current sensor generates a second signal.

11. The power regulator of claim 10, wherein the control circuitry uses either the first or second signals to control the output power of the power amplifier.

12. The power regulator of claim 11, wherein the control circuitry uses the signal having the lower voltage level to control the output power of the power amplifier.

13. A method of controlling the output power of a power amplifier comprising:
   sensing the power amplifier supply voltage;
   sensing the power amplifier supply current;
   comparing the sensed power amplifier supply voltage and the sensed power amplifier supply current; and
   regulating the supply voltage of the power amplifier based on a desired power amplifier output power level, and on the comparison of the sensed power amplifier supply voltage and the sensed power amplifier supply current.

14. The method of claim 13, further comprising:
   generating a first signal based on the sensed power amplifier supply voltage; and
   generating a second signal based on the sensed power amplifier supply current.

15. The method of claim 14, wherein the supply voltage of the power amplifier is regulated using the lower of the first and second signals.

16. The method of claim 14, wherein the first signal is used to regulate the output voltage of the power amplifier while the output voltage of the power amplifier is above a threshold level, and the second signal is used to regulate the output voltage of the power amplifier while the output voltage of the power amplifier is below a threshold level.

17. The method of claim 13, further comprising using a power control signal with the sensed power amplifier supply voltage or the sensed power amplifier supply current to control the output voltage of the power amplifier.

18. The method of claim 13, wherein the supply voltage of the power amplifier is regulated using the sensed power amplifier supply voltage at high output power levels, and using the sensed power amplifier supply current at low output power levels.

* * * * *